(12) United States Patent
Moldsvor

(10) Patent No.: US 8,279,006 B2
(45) Date of Patent: Oct. 2, 2012

(54) LOW NOISE AMPLIFIER

(75) Inventor: Øystein Moldsvor, Tiller (NO)

(73) Assignee: Hittite Microwave Norway AS, Tiller (NO)

( * ) Notice: Subject to any disclaimer, the term of this patent is extended or adjusted under 35 U.S.C. 154(b) by 32 days.

(21) Appl. No.: 12/740,561

(22) PCT Filed: Oct. 23, 2008

(86) PCT No.: PCT/IB2008/003848
§ 371 (c)(1),
(2), (4) Date: Jul. 8, 2010

(87) PCT Pub. No.: WO2009/087482
PCT Pub. Date: Jul. 16, 2009

(65) Prior Publication Data
US 2010/0295619 A1    Nov. 25, 2010

Related U.S. Application Data

(60) Provisional application No. 60/987,118, filed on Nov. 12, 2007.

(51) Int. Cl.
*H03F 3/16* (2006.01)
*H03F 3/45* (2006.01)
(52) U.S. Cl. ......................... 330/277; 330/260
(58) Field of Classification Search ............. 330/253, 330/260, 277
See application file for complete search history.

(56) References Cited

U.S. PATENT DOCUMENTS

| | | | |
|---|---|---|---|
| 3,916,333 A | 10/1975 | Zuk | |
| 6,278,321 B1 * | 8/2001 | Franck | 330/254 |
| 6,356,152 B1 | 3/2002 | Jezdic et al. | |
| 6,369,658 B1 | 4/2002 | Nilson | |
| 6,566,951 B1 | 5/2003 | Merrigan et al. | |
| 6,583,667 B1 | 6/2003 | Dasgupta et al. | |
| 6,734,736 B2 | 5/2004 | Gharpurey | |
| 7,202,738 B1 | 4/2007 | Huijsing et al. | |
| 7,688,144 B2 | 3/2010 | Lee | |

(Continued)

FOREIGN PATENT DOCUMENTS

EP    1 686 686 A1    8/2006

(Continued)

OTHER PUBLICATIONS

International Search Report for related international application No. PCT/IB2008/003848 report dated Jul. 6, 2009.

Sang-Soo Lee, et al.: "A BiCMOS Continuous-Time Filter for Video Signal Processing Applications" IEEE Journal of Solid-State Circuits, IEEE Service Center, Piscataway, NJ, US, vol. 33, No. 9; Sep. 1, 1998, XP011060805 ISSN: 0018-9200; figures 11, 18.

*Primary Examiner* — Steven J Mottola
(74) *Attorney, Agent, or Firm* — Rajesh Vallabh; Foley Hoag LLP

(57) ABSTRACT

An embodiment of an LNA includes a voltage input, a voltage output, an input transistor connected as a source follower with a current source at the drain and source nodes of the input transistor, an input resistor connected between the source follower source node and signal ground, a gain boosting transistor with the gate connected to the input transistor drain node, wherein the source node is connected to ground and the drain node is connected through a load resistor to the input transistor source node. Such an LNA provides substantial improvement in power efficiency by adapting an output stage of the LNA to reuse the supply current of the input transistors to the LNA through a load resistor.

15 Claims, 4 Drawing Sheets

| U.S. PATENT DOCUMENTS | | |
|---|---|---|
| 2003/0122622 A1 | 7/2003 | Gharpurey |
| 2004/0027200 A1 | 2/2004 | Ashby et al. |
| 2004/0174199 A1 | 9/2004 | Simon |
| 2004/0203553 A1 | 10/2004 | Toyota et al. |
| 2007/0096814 A1 | 5/2007 | Chiu |

| FOREIGN PATENT DOCUMENTS | | |
|---|---|---|
| FR | 2 687 865 A | 8/1993 |
| FR | 2 756 436 A | 5/1998 |
| GB | 2 137 039 A | 9/1984 |

* cited by examiner

LOW NOISE AMPLIFIER

This application is a U.S. National Stage filing under 35 U.S.C. §371 of International Patent Application No. PCT/IB2008/003848 filed on Oct. 23, 2008, which claims priority to U.S. Provisional Application Ser. No. 60/978,118 filed on Nov. 12, 2007.

BACKGROUND

1. Technical Field

Low noise amplifiers employed for wide band low frequency signals are disclosed.

2. Description of the Related Art

Low noise amplifiers (LNA) are important building blocks in several electronic systems interfacing to sensors, transducers or other signal sources. Getting the input referred noise as low as possible or sufficiently low for an application is one of the design objectives for LNAs. At the same time, because the supply current is limited in most systems, low power dissipation is also one of the objectives.

Several different architectures for LNAs exist. For example, various embodiments described herein are related to LNA architecture used for wideband low frequency signals based on an open loop configuration. A typical implementation of such an LNA is shown in FIG. 1. The circuit 10 illustrated in FIG. 1 operates as follows.

The input transistors M1 and M2 are PMOS transistors connected as source followers. Assuming an ideal behavior of the source followers, the input voltage $$V_{IN} = V_{INP} - V_{INN}$$

is applied directly across $R_I$. In this situation, the current $I_{IN}$ through $R_I$, will therefore be equal to:

$$I_{IN} = V_{IN}/R_I \qquad \text{(Equation 1)}$$

Hence, the input stage operates as a trans-conductor converting the input signal voltage, $V_{IN}$, to a signal current, $I_{IN}$. The signal current is then mirrored by the transistor pairs M3/M5 and M4/M6 and applied to the load resistors $R_L$, generating the output voltage $$V_{OUT} = V_{OP} - V_{ON}$$

Under ideal circumstances, the voltage gain $G_{in}$ of the LNA would be $$G_{in} \sim (2 \cdot R_L \cdot M)/R_I \qquad \text{(Equation 2)}$$

wherein M is the mirror gain of transistor pairs M3/M5 and M4/M6.

However, non-idealities in transistor characteristics would degrade the gain and linearity of such an amplifier since part of the input signal would be left across the input transistors M1 and M2. The requirement for Equation 2 is that the trans-conductance of the input devices M1 and M2 is much larger than $1/R_I$. This is typically obtained by boosting the trans-conductance of the input device. An example of such an LNA embodiment is disclosed in T. Kwan and K. Martin, *An Adaptive Analog Continuous-Time CMOS Biquadratic Filter*, IEEE Journal of Solid-State Circuits, Vol. 26, No. 6, June 1991. Such an implementation of an LNA 20 is also illustrated in FIG. 2.

In this embodiment, any change in gate-source voltage of M1 and M2 would be amplified with a relatively high gain to the gate voltages of M3 and M4. A negative feedback path is added back to the source voltage of M1 and M2 controlling the current through M1 and M2 to be nearly constant and hence controlling the gate-source voltage of M1 and M2 to be nearly constant. This is similar to increasing the trans-conductance of M1 to M2. The result is that nearly all current flowing through RI is conducted through M3 and M4 instead of through M1 and M2. Hence, the signal current will be present in M3 and M4 and copied to the output branch by M5 and M6.

A considerable disadvantage with the embodiment shown in FIG. 2 is that multiple branches of supply current exist. Current is copied from M3 and M4 to M5 and M6 respectively. Assuming a mirror gain between M3 and M5 and between M4 and M6 of unity, the total consumed current will be two times the standby current of M3 and M4. This results in unnecessarily high total power dissipation. Therefore, there is a need for a more efficient VGA implementation.

SUMMARY OF THE DISCLOSURE

A low noise amplifier (LNA) disclosed herein provides substantial improvement in power efficiency by adapting an output stage of the LNA to reuse the supply current of the input transistors of the LNA through a load resistor.

An embodiment of such an LNA for a single ended implementation includes a voltage input, a voltage output, an input transistor connected as a source follower with a current source at the drain and source nodes of the input transistor, an input resistor connected between the source follower source node and signal ground, a gain boosting transistor with the gate connected to the input transistor drain node, wherein the source node is connected to ground and the drain node is connected through a load resistor to the input transistor source node.

Other advantages and features will be apparent from the following detailed description when read in conjunction with the attached drawings.

BRIEF DESCRIPTION OF THE DRAWINGS

For a more complete understanding of the disclosed methods and apparatuses, reference should be made to the embodiment illustrated in greater detail on the accompanying drawings, wherein.

It should be understood that the drawings are not necessarily to scale and that the disclosed embodiments are sometimes illustrated diagrammatically and in partial views. In certain instances, details which are not necessary for an understanding of the disclosed embodiments apparatuses or which render other details difficult to perceive may have been omitted. It should be understood, of course, that this disclosure is not limited to the particular embodiments illustrated herein.

DETAILED DESCRIPTION OF THE PRESENTLY PREFERRED EMBODIMENTS

Figure 3:
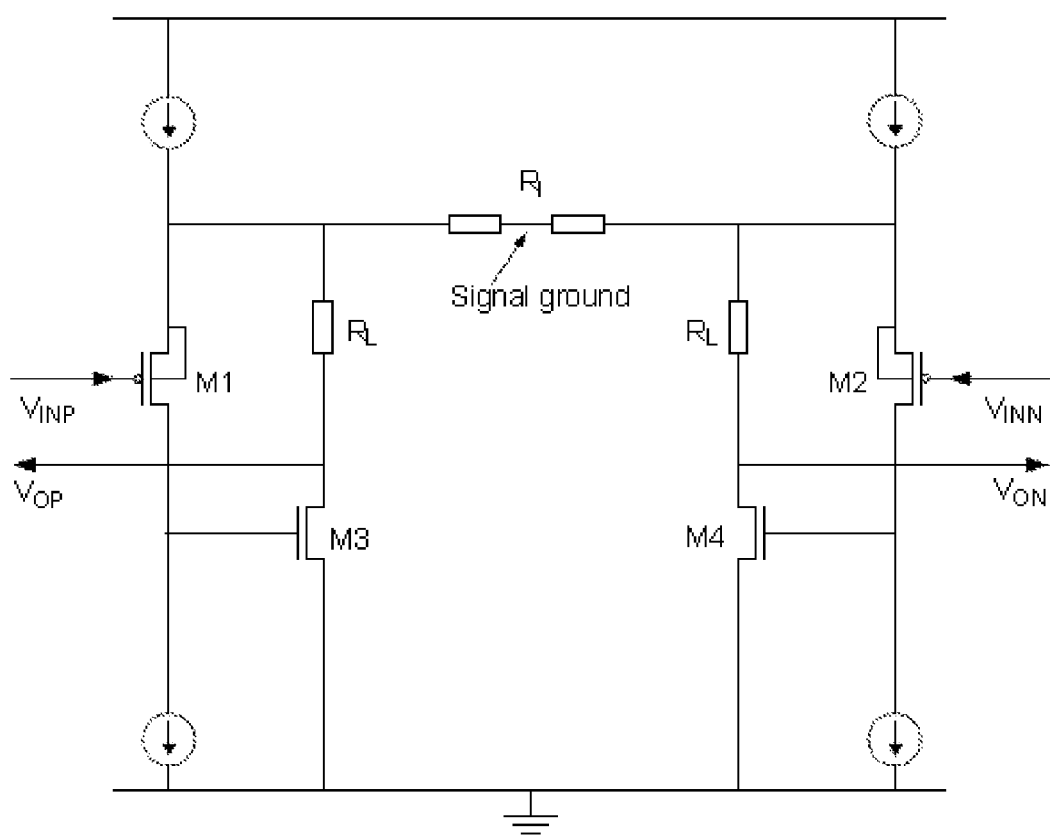
FIG. 3 is a schematic circuit diagram of an embodiment of LNA adapted to reduce supply current.
Figure 4:
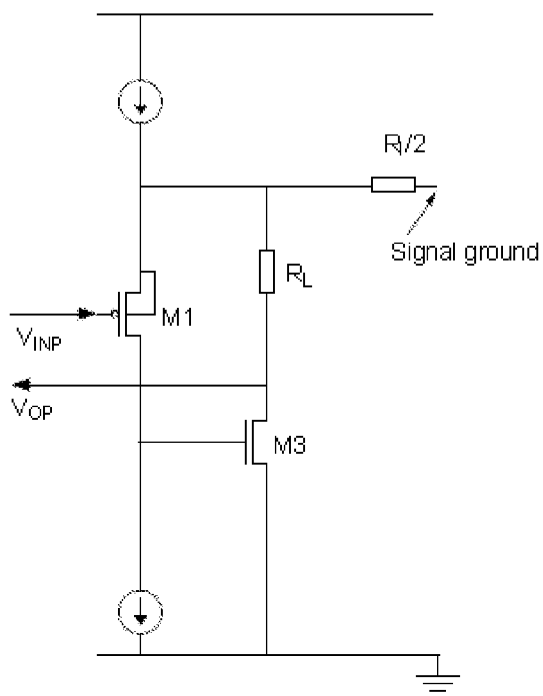
FIG. 4 is a schematic circuit diagram of a LNA in a single ended implementation in accordance with one or more embodiments.
Figure 5:
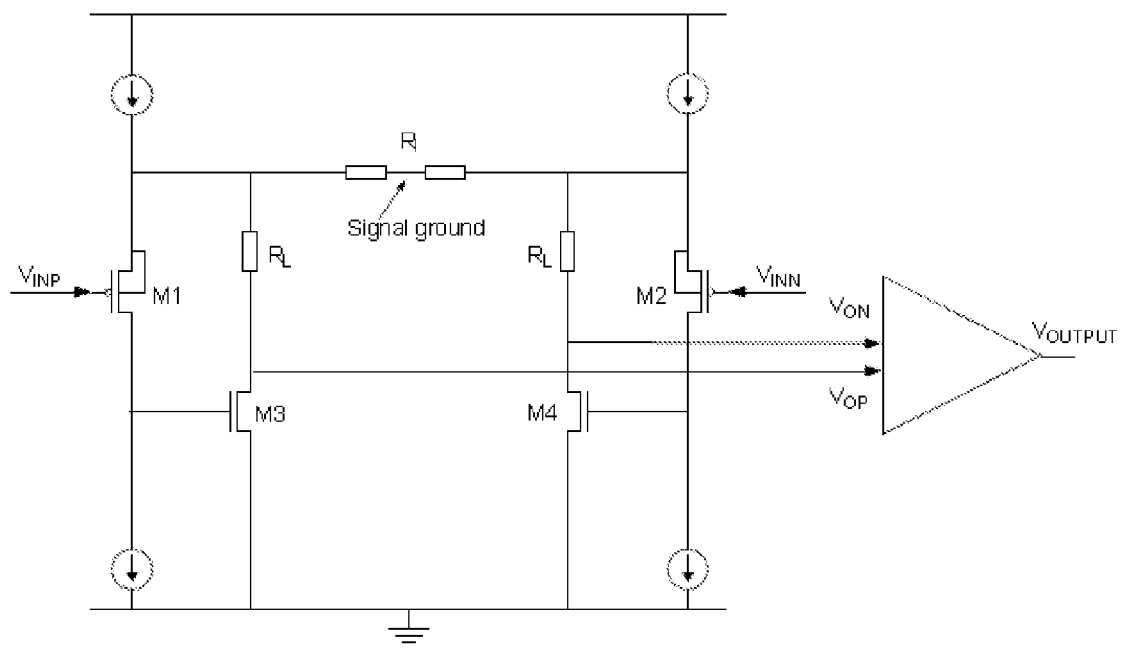
FIG. 5 is a schematic circuit diagram of a multistage amplifier having a LNA as an input amplifier in accordance with one or more embodiments.

The operation of a low noise amplifier (LNA) 30 providing improved power efficiency is disclosed in FIG. 3. In the LNA 30, the input transistors M1 and M2 are PMOS transistors connected as source followers. The input voltage, $$V_{IN}=VINP-V_{INN}$$

is copied from the input terminals and applied across the input resistor RI by the source followers. Hence, the input stage operates as a trans-conductor converting the input signal voltage to a signal current. Assuming ideal behavior of the source followers, the current $I_{IN}$ through $R_I$, will be equal to:

$$I_{IN}=V_{IN}/R_I \quad \text{(Equation 1)}$$

However, non-idealities in transistor characteristics will result in that part of the input voltage is left across M1 and M2. This happens because the current, $I_{IN}$ will be conducted through M1 and M2, and the change in current results in a change in voltage from gate to source.

Therefore, the LNA 30 also includes a pair of gain boosting transistors M3 and M4 with the gate of each gain boosting transistors connected to the drain nodes of the input transistors M1 and M2. Any change in the current through M1 and M2 will result in a high voltage change at the gate of M3 and M4 due to the high impedance in the drain path of M1 and M2. The result is that M3 and M4 form a negative feedback loop keeping the current through M1 and M2 nearly constant, and the voltage from gate to source of M1 and M2 nearly constant. Hence, the effective transconductance of transistor M1 and M2 is boosted by M3 and M4. Since the currents through M1 and M2 are kept constant, nearly all the current $I_{IN}$ will be conducted through M3 and M4. This is equivalent to the prior art solution shown in FIG. 2.

Figure 1:
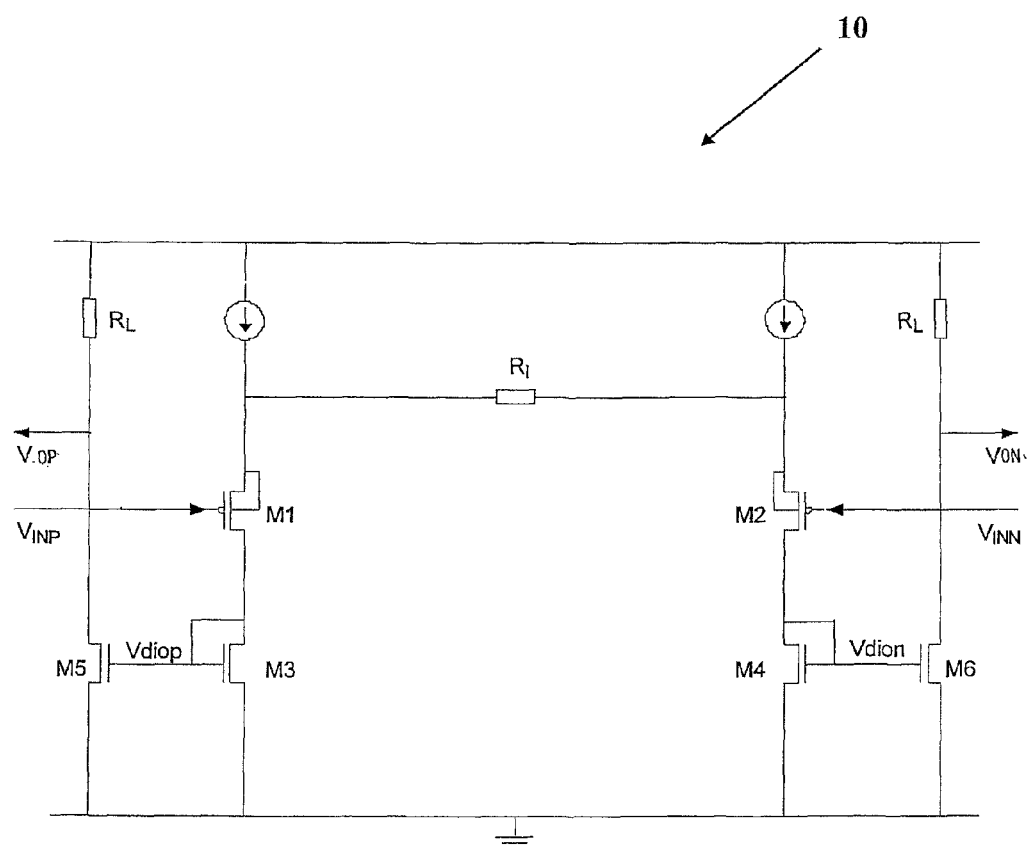
FIG. 1 is a schematic circuit diagram of a prior art LNA.
Figure 2:
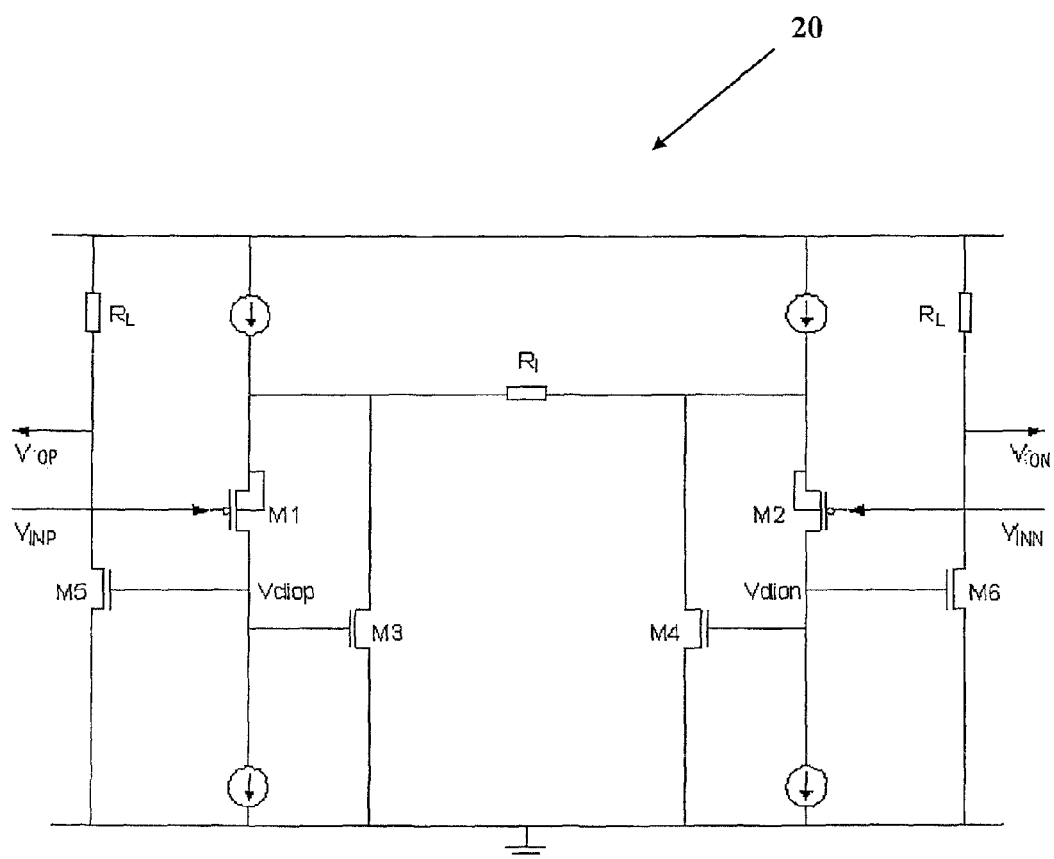
FIG. 2 is a schematic circuit diagram of a prior art LNA with active boosting of input transistor trans-conductance.

To avoid increasing the supply current by multiplying the M3 and M4 currents as done in the prior art solution of FIG. 2, load resistors RL are inserted in the drain current branches of the transistors M3 and M4. Since nearly all the signal current, $I_{IN}$, going through $R_I$ is conducted through M3 and M4, the signal current will also be conducted through the load resistors $R_L$. Now, the same current is flowing through both the input and load resistors, resulting in a more power efficient design than the prior art solution where the input current is multiplied before it is applied to the load resistors. As the load resistors $R_L$ are conducting the signal current, the output voltage will be present at the drain nodes of M3 and M4 labeled $V_{OP}$ and $V_{ON}$ in FIG. 3. The voltage gain G30 of the LNA 30 can be calculated to be $$G30 \sim 1+(2*R_L/R_I) \quad \text{(Equation 3)}$$

Equation 3 shows that the voltage gain is increased over the prior art solution since there is a fixed gain of 1 plus the resistor ratio. This is due to the fact that the load resistors are connected directly to the source nodes of M1 and M2 where the input signal already is present. Thus, one of the advantages of using the LNA 30 is the increased voltage gain over prior art solutions.

While only certain embodiments have been set forth, alternatives and modifications will be apparent from the above description to those skilled in the art. These and other alternatives are considered equivalents and within the spirit and scope of this disclosure and the appended claims.

What is claimed:

1. A low noise amplifier (LNA), comprising:
   a voltage input;
   a voltage output;
   an input transistor comprising drain and source nodes, wherein the input transistor is connected as a source follower;
   an input resistor connected between the source follower source node and a signal ground;
   a gain boosting transistor with the gate connected to the drain node of the input transistor; and
   wherein a source node of the gain boosting transistor is connected to ground and a drain node of the gain boosting transistor is connected through a load resistor to the input transistor source node.

2. The LNA of claim 1, wherein the voltage output is the drain node of the gain boosting transistor.

3. The LNA of claim 1 implemented as a differential circuit wherein the input resistor is connected between a non-inverting input source follower source node and an inverting input source follower source node.

4. A multi stage amplifier having the LNA of claim 1 as an input amplifier.

5. A low noise amplifier (LNA), comprising:
   a voltage input;
   a voltage output;
   an input transistor comprising a drain node and a source node, the input transistor connected as a source follower;
   an input resistor connected between the source node of the input transistor and a signal ground;
   a gain boosting transistor with a gate connected to the drain node of the input transistor; and
   wherein the source node of the gain boosting transistor is connected to ground and the drain node of the gain boosting transistor is connected through a load resistor to the source node of the input transistor.

6. The LNA of claim 5, wherein the voltage output is the drain node of the gain boosting transistor.

7. The LNA of claim 6 implemented as a differential circuit wherein the input resistor is connected between a non-inverting input source follower source node and an inverting input source follower source node.

8. A multi stage amplifier having the LNA of claim 5 as an input amplifier.

9. The LNA of claim 1, wherein a current source is operatively coupled to the drain and source nodes of the input transistor.

10. The LNA of claim 5, wherein a current source is operatively coupled to the drain and source nodes of the input transistor.

11. A low noise amplifier (LNA), comprising:
    a voltage input;
    a voltage output;
    an input transistor;
    an input resistor connected between a source node of the input transistor and a signal ground;
    a load resistor;
    a gain boosting transistor with a gate connected to a drain node of the input transistor, a source node connected to ground, and a drain node connected through the load resistor to the source node of the input transistor, such that the gain boosting transistor reuses supply current of the input transistor through the load resistor.

12. The LNA of claim 11, wherein the voltage output is the drain node of the gain boosting transistor.

13. The LNA of claim 11 implemented as a differential circuit wherein the input resistor is connected between a non-inverting input source follower source node and an inverting input source follower source node.

14. A multi stage amplifier having the LNA of claim 11 as an input amplifier.

15. The LNA of claim 11, wherein the input transistor is connected as a source follower with a current source operatively coupled to the drain and source nodes of the input transistor.

* * * * *